(12) United States Patent
Allibert et al.

(10) Patent No.: US 11,688,627 B2
(45) Date of Patent: Jun. 27, 2023

(54) SUBSTRATE FOR RADIOFREQUENCY APPLICATIONS AND ASSOCIATED MANUFACTURING METHOD

(71) Applicant: Soitec, Bernin (FR)

(72) Inventors: Frederic Allibert, Grenoble (FR); Christelle Veytizou, Bernin (FR); Damien Radisson, Brignoud (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/982,986

(22) PCT Filed: Mar. 13, 2019

(86) PCT No.: PCT/FR2019/050539
§ 371 (c)(1),
(2) Date: Sep. 21, 2020

(87) PCT Pub. No.: WO2019/186010
PCT Pub. Date: Oct. 3, 2019

(65) Prior Publication Data
US 2021/0028057 A1   Jan. 28, 2021

(30) Foreign Application Priority Data

Mar. 30, 2018   (FR) ...................................... 1852795

(51) Int. Cl.
*H01L 21/762*   (2006.01)
*H01L 23/29*   (2006.01)
(Continued)

(52) U.S. Cl.
CPC ...... *H01L 21/76251* (2013.01); *H01L 23/291* (2013.01); *H01L 23/3171* (2013.01); *H01L 23/3733* (2013.01)

(58) Field of Classification Search
None
See application file for complete search history.

(56) References Cited

U.S. PATENT DOCUMENTS 3,212,921 A * 10/1965 Pliskin ................. H01G 13/003
                                                       428/68
3,909,332 A *  9/1975 Yerman ................. H01L 23/291
                                                       438/455
(Continued)

FOREIGN PATENT DOCUMENTS

EP    3109893 A1   12/2016
EP    3203495 A1    8/2017
(Continued)

OTHER PUBLICATIONS

Singapore Written Opinion from Singapore Application No. 11202008491Q, dated Jul. 19, 2021, 7 pages.
(Continued)

*Primary Examiner* — Erik Kielin
(74) *Attorney, Agent, or Firm* — TraskBritt (57) ABSTRACT

A substrate for radiofrequency microelectronic devices comprises a carrier substrate made of a semi-conductor, a sintered composite layer disposed on the carrier substrate and formed from powders of at least a first dielectric material and a second dielectric different from the first material, the sintered composite layer having a thickness larger than 5 microns and a thermal expansion coefficient that is matched with that of the carrier substrate to plus or minus 30%.

17 Claims, 5 Drawing Sheets

(51) Int. Cl.
*H01L 23/31* (2006.01)
*H01L 23/373* (2006.01)

(56) References Cited

U.S. PATENT DOCUMENTS

| | | | | |
|---|---|---|---|---|
| 4,133,690 | A * | 1/1979 | Muller | C03C 14/004 |
| | | | | 428/428 |
| 4,544,576 | A * | 10/1985 | Chu | H01L 21/31051 |
| | | | | 257/E21.243 |
| 6,171,931 | B1 * | 1/2001 | Murari | H01L 24/83 |
| | | | | 438/455 |
| 2005/0196934 | A1 * | 9/2005 | Tazoe | H01L 21/7624 |
| | | | | 438/409 |
| 2006/0091400 | A1 * | 5/2006 | Faure | H01L 21/76254 |
| | | | | 257/E21.568 |
| 2007/0032040 | A1 * | 2/2007 | Lederer | H01P 3/006 |
| | | | | 438/455 |
| 2017/0069785 | A1 * | 3/2017 | Tak | H01L 33/0075 |
| 2018/0118562 | A1 * | 5/2018 | Drescher | B81C 1/00357 |

FOREIGN PATENT DOCUMENTS

| | | |
|---|---|---|
| FR | 2990561 B1 | 9/2016 |
| JP | 1997-027604 A | 1/1997 |
| JP | 2016-072540 A | 5/2016 |
| JP | 2017-504210 A | 2/2017 |
| WO | WO-03036699 A2 * | 5/2003 ......... H01L 21/0405 |

OTHER PUBLICATIONS

International Search Report for International Application No. PCT/FR2019/050539 dated Jul. 2, 2019, 2 pages.
International Written Opinion for International Application No. PCT/FR2019/050539 dated Jul. 2, 2019, 6 pages.
Kononchuk et al., "Silicon-on-insulator Soi Technology: Manufacture and Applications", Woodhead Publishing Series in Electronic Series in Electronic and Optical Materials, https://www.kinokuniya.co.jp/f/dsg-02-9780857095268, Jan. 31, 2017, 4 pages.
Taiwanese Office Action for Application No. 108108634 dated Aug. 15, 2022.
Japanese Notice of Reasons for Rejection for Application No. 2020-543844 dated Jan. 17, 2023, 3 pages.

* cited by examiner

FIG. 1

| Material | Thermal expansion coefficient (x1E-6) (/K) | Resistivity (ohm.cm) | Permittivity | Young's modulus(GPa) |
|---|---|---|---|---|
| SiO2 | 0,56 | 1,00E+17 | 3,9 | 66 |
| Si3N4 | 1.4~3.7 / 3.2 | 1e10 - 1e15 | 9.5-10.5 | 160-310 |
| Al2O3 | 8.1 - 8.4 / 6 - 7 | >1E14 | 9,8 | 300-375 |
| mullite (3Al2O3.2SiO2) | 5,4 | >1E13 | 5,8 | 151 |
| AlN | 4.3~5.6 | 1,00E+14 | 9 | 330 |

SUBSTRATE FOR RADIOFREQUENCY APPLICATIONS AND ASSOCIATED MANUFACTURING METHOD

CROSS-REFERENCE TO RELATED APPLICATIONS

This application is a national phase entry under 35 U.S.C. § 371 of International Patent Application PCT/FR2019/050539, filed Mar. 13, 2019, designating the United States of America and published as International Patent Publication WO 2019/186010 A1 on Oct. 3, 2019, which claims the benefit under Article 8 of the Patent Cooperation Treaty to French Patent Application Serial No. 1852795, filed Mar. 30, 2018.

TECHNICAL FIELD

The present disclosure relates to the field of integrated radiofrequency devices, and, more particularly, to a substrate suitable for such devices and to an associated fabrication process.

BACKGROUND

In most applications involving the transmission or reception of radiofrequency signals (10 MHz to 100 GHz), device fabrication requires a substrate that meets an increasingly demanding set of specifications, in particular, resulting from the evolution of mobile telephony standards (2G, 3G, LTE, LTE Advanced, LTE Advanced PRO, 5G etc.). The properties of the materials of the substrate must, in particular, guarantee:

- low insertion losses (low attenuation of the signal) and a good linearity (low distortion of the signal, cause of harmonics), typically achieved via an effective resistivity, over a wide frequency range, higher than 1000 ohms·cm;
- temperature stability of these figures of merit, in particular, in the operating range of the devices [−40° C.; 150° C.];
- a low capacitive coupling between the active layer and the carrier substrate, typically achieved by virtue of a dielectric permittivity equal to or lower than that of silicon ($\varepsilon_{silicon}$=11).

Moreover, to meet the need for high volumes, the substrate must be compatible with the semiconductor industry, and, in particular, with silicon CMOS fabrication lines. Of course, it must in addition have a competitive cost in order to be adopted in mass-market applications, in particular, in the field of telecommunications (cellular networks and telephony, Wi-Fi connectivity, Bluetooth).

Radiofrequency (RF) devices, such as antenna adapters and switches, power amplifiers, low-noise amplifiers or even passive (R, L, C) components may be produced on various types of substrates.

For example, silicon-on-sapphire (SOS) substrates are known, this type of substrate allowing components produced in microelectronic technologies in the silicon surface layer to benefit from the insulating properties of the sapphire substrate, which are independent of temperature, from its thermal conductivity, which is higher than 20 W/m·K, and from its permittivity, which is lower than 11. For example, antenna switches and power amplifiers fabricated on this type of substrate have very good figures of merit but are mainly used for niche applications because of the very high overall cost of this solution.

Substrates based on high-resistivity silicon comprising a carrier layer, a trapping layer (of a few hundred nanometers to a few microns in thickness) placed on the carrier substrate, a dielectric layer placed on the trapping layer, and a semiconductor layer placed on the dielectric layer are also known. The carrier substrate usually has a resistivity higher than 1 kOhm·cm. The trapping layer may comprise undoped polysilicon. The combination of a carrier substrate made of high-resistivity silicon and a trapping layer according to the prior art allows the parasitic conduction layer usually present under the buried oxide layer in HR SOI substrates (silicon-on-insulator substrates with a carrier substrate made of high-resistivity silicon) to be removed. The reader will find a review of the performance of RF devices fabricated on a known prior-art high-resistivity semiconductor substrate in "Silicon-on-insulator (SOI) Technology, manufacture and applications," sections 10.7 and 10.8, Oleg Kononchuk and Bich-Yen Nguyen, published by Woodhead Publishing.

Nevertheless, a polysilicon trapping layer has the drawback of undergoing partial recrystallization in high-temperature heat-treatment steps, this contributing to decreasing the density of traps in the layer. The degradation of the performance of the RF device related to this decrease in trap density may be unacceptable for certain applications. Moreover, it is not easy with these substrates to guarantee stability in RF performance over the entire temperature range of use, in particular, above 100° C.: their resistivity drops on account of the generation of thermal carriers in the carrier substrate and device/substrate coupling becomes a major contributor to signal attenuation and distortion.

To improve the performance of these substrates, it could be envisioned to increase the thickness of the trapping layer (beyond a few microns), in order to increase the number of available traps and to increase the distance between the carrier substrate and the devices, thus limiting the impact of the thermal carriers generated in the carrier substrate. This option nevertheless has the drawback of increasing the stress on and the bow of the substrates, which become difficult or even impossible to process in standard microelectronic equipment.

Other carrier substrates, such as substrates made of aluminum nitride or silicon carbide, meet the specifications in terms of RF properties but they are not directly compatible with standard semiconductor-industry technology. Their use as a carrier substrate of a transferred final device layer can be envisioned; nevertheless, the cost of these specific materials combined with that of circuit-transfer technologies is still too high for mass adoption of these solutions.

BRIEF SUMMARY

One subject of the present disclosure is therefore to provide a substrate suitable for radiofrequency applications, which remedies all or some of the drawbacks of the prior art.

The present disclosure relates to a substrate for radiofrequency microelectronic devices comprising a carrier substrate made of a semiconductor, and a sintered composite layer placed on the carrier substrate and formed from powders of at least a first dielectric and a second dielectric different from the first; the sintered composite layer has a thickness larger than 5 microns and a thermal expansion coefficient that is matched with that of the carrier substrate, to within (plus or minus) 30%.

According to advantageous features of the present disclosure, taken alone or in combination:

- the sintered composite layer has a thickness between 10 microns and 100 microns;

the thermal expansion coefficient of the sintered composite layer is matched with that of the carrier substrate, to within 10%, or even within 5%;

the carrier substrate has a resistivity higher than 500 ohm·cm;

the carrier substrate is made of silicon;

the first and second dielectrics are chosen from silicon oxide, silicon nitride, aluminum nitride, alumina, and mullite;

the substrate comprises a protective layer placed between the carrier substrate and the sintered composite layer;

the substrate comprises an intermediate layer placed on the sintered composite layer;

the intermediate layer is a dielectric layer formed from a material chosen from a silicon oxide, a silicon nitride, a silicon oxynitride, and an aluminum nitride;

the substrate comprises a useful layer placed on the intermediate layer;

the useful layer is composed of a material chosen from the semiconductors, insulators or conductors, or even the piezoelectrics.

The present disclosure also relates to a radiofrequency-microelectronic-device structure comprising:

a substrate as described herein; and a layer of microelectronic devices, which layer is placed on the substrate.

According to advantageous embodiments, the microelectronic device may be selected from among an antenna adapter, switch, a power amplifier, a low-noise amplifier, a passive component, a circuit operating at high frequency, a radiofrequency MEMS component, and/or a radiofrequency filter.

The present disclosure also relates to a process for fabricating a substrate for radiofrequency microelectronic devices, comprising the following steps:

a) providing a carrier substrate made of a semiconductor, having a first side;

b) depositing a layer formed from a mixture of powders of at least a first dielectric and a second dielectric different from the first, on the first side of the carrier substrate; and c) sintering the layer formed from the mixture of powders in order to obtain a sintered composite layer that is firmly attached to the first side of the carrier substrate and that has a thickness larger than 5 microns; the first dielectric, the second dielectric and the proportion of the dielectrics in the mixture of powders being chosen to give the sintered composite layer a thermal expansion coefficient that is matched with that of the carrier substrate, to within 30%.

According to advantageous features of the present disclosure, taken alone or in combination:

the first side of the carrier substrate comprises a protective layer, prior to the deposition of the layer formed from the mixture of powders in step b);

the protective layer is formed by at least one material chosen from silicon nitride, silicon oxynitride, and silicon oxide;

the mixture of powders takes the form of a viscous paste, and the layer formed by the mixture is deposited, in step b), by spin coating;

the deposition of the layer formed by the mixture of powders is followed by a low-temperature heat treatment in order to remove at least one liquid component from the viscous paste;

the process comprises, after step c), a step d) of bonding a useful layer and the carrier substrate so as to place the sintered composite layer between the useful layer and the carrier substrate;

an intermediate layer is placed between the useful layer and the sintered composite layer;

the useful layer provided for bonding step d) is a donor substrate composed of a material chosen from the semiconductors, insulators or conductors, or even piezoelectrics;

the process comprises a step e) of thinning the donor substrate to the thickness desired for the useful layer for the fabrication of the radiofrequency microelectronic devices.

BRIEF DESCRIPTION OF THE DRAWINGS

Other features and advantages of the present disclosure will become apparent from the following detailed description of example embodiments of the present disclosure, which description is given with reference to the appended figures, in which.

DETAILED DESCRIPTION

In the description, the same references in the figures might be used for elements of the same type. The figures are schematic representations that, for the sake of legibility, are not to scale. In particular, the thicknesses of the layers along the z-axis are not to scale with respect to their lateral dimensions along the x- and y-axes; and the relative thicknesses of the layers with respect to one another are not necessarily respected in the figures.

Figure 1:
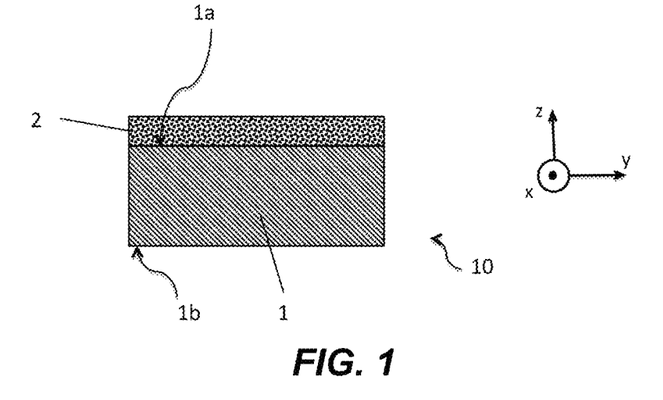
FIG. 1 shows a substrate according to the present disclosure.

The present disclosure relates to a substrate 10 suitable for the fabrication of radiofrequency microelectronic devices, comprising a carrier substrate 1 made of a semiconductor (FIG. 1). Advantageously, the carrier substrate 1 is formed from a single-crystal silicon.

The substrate 10 according to the present disclosure also comprises a sintered composite layer 2 placed on the carrier substrate 1 and formed from powders of at least two different dielectrics (FIG. 1). By sintered layer, what is meant is a layer resulting from the consolidation of a mixture of powders: this consolidation is obtained by input of thermal energy and optionally mechanical energy, but without melting at least one of the pulverulent materials of the mixture. The sintered nature of the composite layer may therefore be detected by structural analysis of the layer (for example, by scanning electron microscopy). The particles or grains of the dielectric powders appear welded together and the density of the composite layer depends on the degree of compaction of the mixture during the input of energy for the consolidation.

The particles forming the powder of each of the dielectrics of the sintered composite layer 2 have dimensions that follow a typically Gaussian distribution. In the remainder of the description, the mean size of the particles will be likened to the equivalent mean diameter of the particles of a given material. The mean size of the particles may typically vary between about 1 micron and 10 microns.

Figure 2:
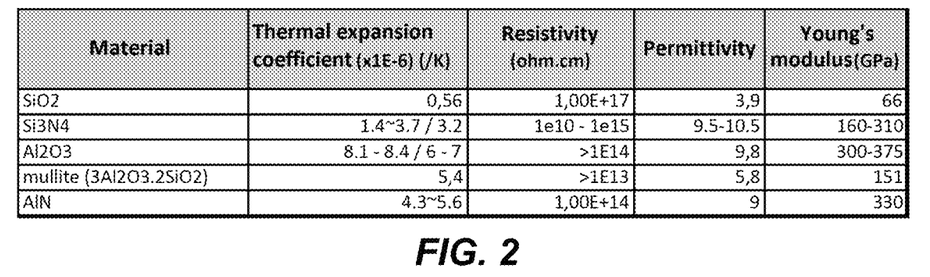
FIG. 2 is a table listing the properties of materials from which the sintered composite layer of a substrate according to the present disclosure may be composed.

Preferably, the at least two dielectrics composing the sintered composite layer 2 (called the first and second dielectrics) are chosen from silicon oxide, silicon nitride, aluminum nitride, alumina, and mullite (FIG. 2), in particular, because of the high resistivity of these materials and their compatibility with high-temperature treatments.

The sintered composite layer 2 optionally might comprise three or more different dielectrics.

The sintered composite layer 2 furthermore has a thickness greater than 5 microns, or even greater than 10 microns. The thickness of the sintered composite layer 2 is chosen depending on the type of radiofrequency microelectronic devices intended to be produced on the substrate 10.

In general, it will have a thickness comprised between 10 microns and 100 microns in order to prevent or at least limit the penetration of the electromagnetic field generated by the RF devices into the carrier substrate 1: thus, the interaction of this electromagnetic field with free carriers (for example, thermal carriers) capable of appearing in the carrier substrate 1 is also limited.

To limit the penetration of the electromagnetic field, the first and second dielectrics will possibly preferably be chosen in order to best decrease the equivalent permittivity of the sintered composite layer 2. A low permittivity (typically lower than 11, the permittivity of silicon) will permit the implementation of smaller thicknesses of composite layer 2.

If the penetration of the electromagnetic field is confined to the sintered composite layer 2, the carrier substrate 1 will be able to have a standard resistivity (typically a few tens of ohms·cm). If the electromagnetic field is capable of penetrating relatively deeply into the carrier substrate 1, the resistivity of the carrier substrate 1 will advantageously be chosen to be higher than 500 ohm·cm, or even than 1 kohm·cm.

The sintered composite layer 2 also has a thermal expansion coefficient (CTE) that is matched with that of the carrier substrate 1. The thermal expansion coefficient of the composite layer 2 is defined by the mean of the thermal expansion coefficients of the constituent dielectrics of the layer 2, weighted by their volume fraction in the composite layer 2. By "matched with the thermal expansion coefficient of the carrier substrate 1," what is meant is as close as possible to the thermal expansion coefficient. According to the present disclosure, the CTE of the sintered composite layer 2 may be within plus or minus 30% of the value of the CTE of the carrier substrate 1. Advantageously, may be within plus or minus 10% of the value of the CTE of the carrier substrate 1, or even within plus or minus 5%, within plus or minus 3%, or even within plus or minus 1%.

By way of example, a sintered composite layer 2 formed from powders of silicon oxide ($SiO_2$) and alumina ($Al_2O_3$), in proportions of 1 volume of $Al_2O_3$ to 2.7 volumes of $SiO_2$, has a thermal expansion coefficient (CTE 2.67E-6/° K) that is matched to the thermal expansion coefficient of a carrier substrate 1 made of silicon (2.6E-6/° K), the difference, in this case, being smaller than 3%.

Advantageously, the CTE of the composite layer 2 is chosen so that the substrate 10, equipped with the composite layer 2, has a thickness larger than 5 microns, and so that its bow does not exceed about 150 microns during the microelectronic processes used to produce the constituent layers of the substrate 10 and components in and on the substrate 10. It will be recalled that the microelectronic processes may in some cases comprise heat treatments at high temperatures, ranging from 900° C. to 1150° C., for example.

Figure 3:
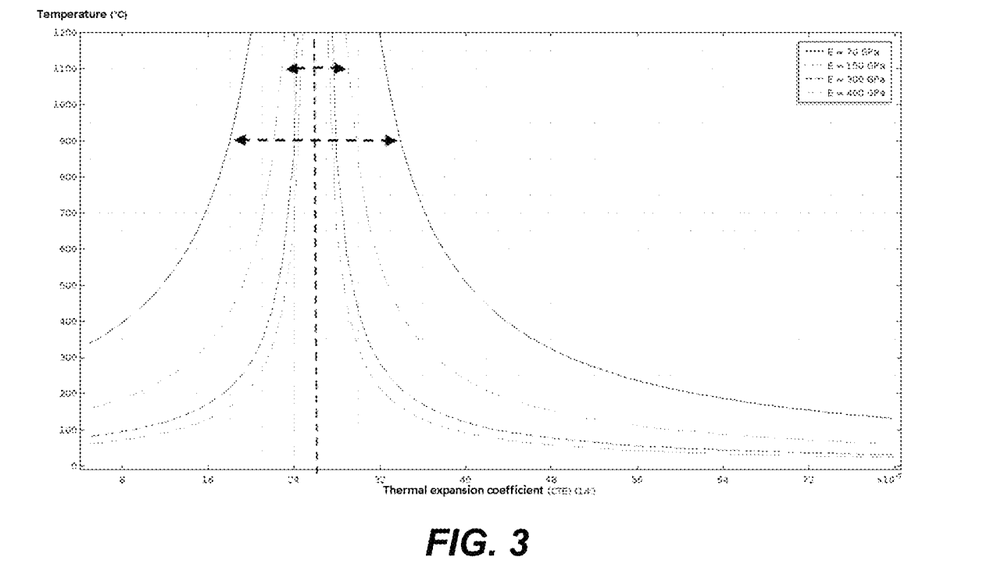
FIG. 3 is a graph showing the temperature at which the bow of a substrate (made of silicon of 750 microns thickness) reaches 150 microns, as a function of the thermal expansion coefficient of the composite layer (5 microns thickness) placed on this substrate and for various Young's moduli of the composite layer.

By way of illustration, the graph in FIG. 3 shows the temperature at which the bow of a substrate 10 (the carrier substrate 1 being made of silicon, of 750 microns thickness and of 300 mm diameter) reaches 150 microns, as a function of the thermal expansion coefficient of the composite layer 2 (5 microns thickness) placed on this substrate and for various Young's moduli of the composite layer 2.

For example, for a maximum treatment temperature of 900° C., if the composite layer 2 has an equivalent Young's modulus (defined as the mean of the Young's moduli of the constituent dielectrics of the layer 2, weighted by their volume fraction) of about 70 GPa, the CTE of the composite layer 2 must differ by at most +/−30% from the value of the CTE of the carrier substrate 1, to remain below the solid curve (i.e., to keep the bow of the substrate 10 below 150 microns).

According to another example, for a maximum treatment temperature of 1100° C., if the composite layer 2 has an equivalent Young's modulus of about 150 GPa, the CTE of the composite layer 2 must differ by at most +/−11% from the value of the CTE of the carrier substrate 1, to remain below the dashed curve corresponding to "E=150 GPa" (i.e., to keep the bow of the substrate 10 below 150 microns).

Figure 4:
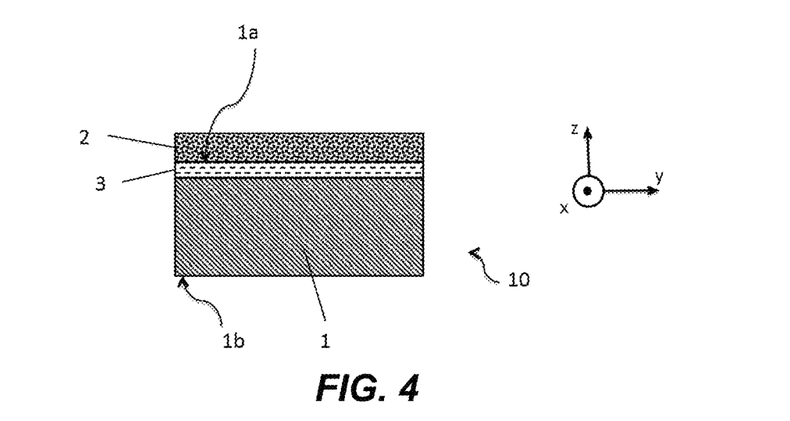
FIGS. 4-7 show substrates according to the present disclosure.
Figure 5:
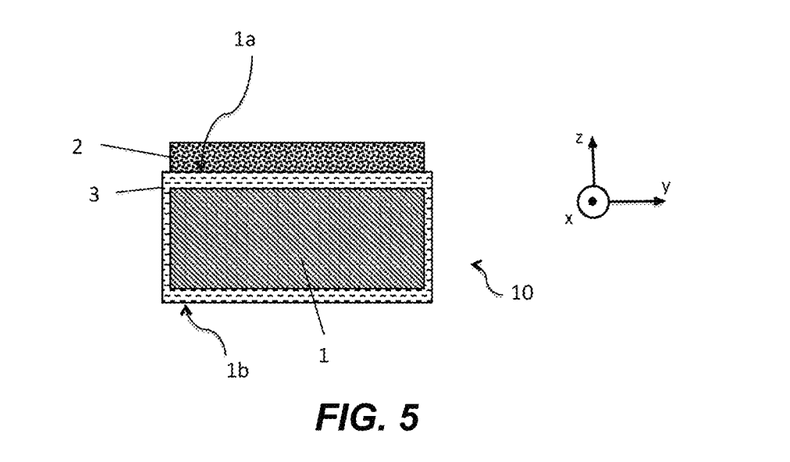

According to one variant, the substrate 10 may comprise a protective layer 3 placed between the carrier substrate 1 and the sintered composite layer 2. As illustrated in FIGS. 4 and 5, the substrate 10 comprises in this case a protective layer 3 placed on its first side 1a, and potentially on the second side 1b and on the edge faces of the carrier substrate 1 (FIG. 5). As will be seen in the description of the fabrication process of the substrate 10, the protective layer 3 makes it possible to avoid or at least limit the diffusion of impurities contained in the sintered composite layer 2, or present during the production of the layer 2, into the carrier substrate 1.

For the fabrication of microelectronic devices on the substrate 10, a useful layer 5 is usually required; it is referred to as "useful" because the devices will subsequently be produced in or on this layer 5.

The substrate 10 according to the present disclosure may thus comprise a useful layer 5 placed on the sintered composite layer 2. The useful layer 5 will possibly be composed of a material chosen from the semiconductors (including silicon, silicon-germanium, germanium, silicon carbide, etc.), insulators or conductors, or even the piezoelectrics (including lithium niobate, lithium tantalate, etc.).

Figure 6:
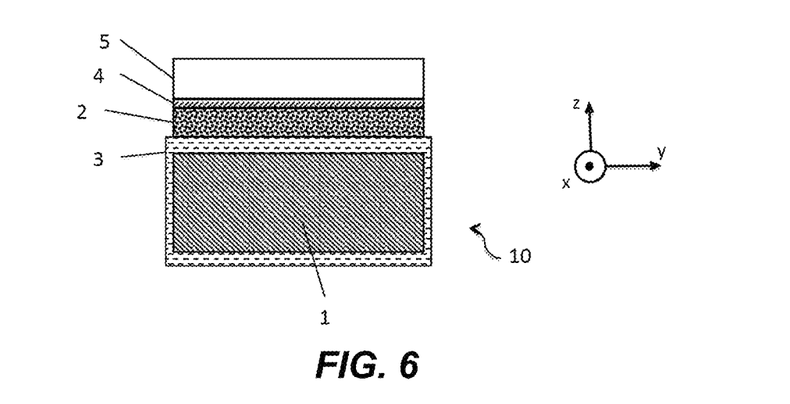
Figure 7:
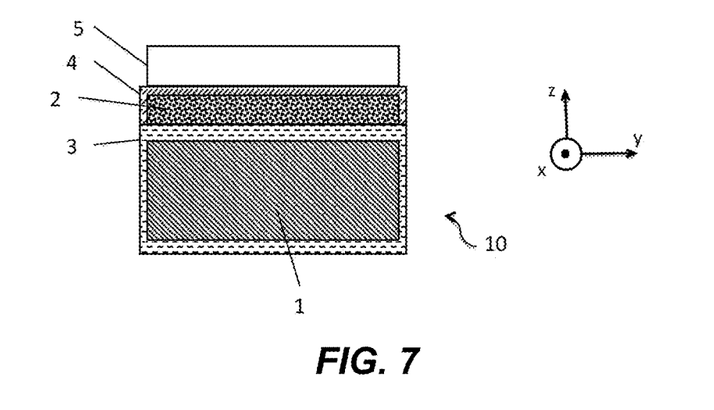

According to one advantageous embodiment, the substrate 10 comprises an intermediate layer 4 placed on the sintered composite layer 2 (FIG. 6) and which may optionally completely encapsulate the composite layer (FIG. 7). The intermediate layer 4 will possibly be a dielectric layer formed from a material chosen from a silicon oxide, a silicon nitride, a silicon oxynitride, and an aluminum nitride, etc.

The useful layer 5 is then placed on the intermediate layer 4. The function of the intermediate layer 4 may, in particular, be to electrically insulate the useful layer 5 and the composite layer 2 from each other, and/or to form a barrier to diffusion preventing contamination of the useful layer 5 by impurities present in the sintered composite layer 2.

The substrate 10 according to the present disclosure comprises a sintered composite layer 2 having the properties of a dielectric and a thermal expansion coefficient that is matched to that of the subjacent carrier substrate 1. The thickness of the composite layer 2 may be chosen depending on the RF microelectronic devices intended to be produced on the substrate 10, so as to prevent (or greatly limit) the penetration of electromagnetic waves into the carrier substrate 1. Since the thermal expansion coefficient of the composite layer 2 is matched with that of the carrier substrate 1, there is no need to limit the thickness of the sintered composite layer 2 for reasons of the stresses and bow induced in the substrate 10.

As described above, the thermal expansion coefficient may be chosen so that, during the heat treatments applied to the substrate 10 to produce the useful layer 5 or the microelectronic devices 20 (typically between 900° and 1150° C.), the amplitude of the bow of the substrate is kept below a threshold compatible with standard steps and standard microelectronic equipment; in particular, a bow lower than 150 microns will be targeted for a substrate of 300 mm diameter.

The sintered composite layer 2, because of its dielectric character and its suitable thickness, thus provides the substrate 10 with the properties required to guarantee:
- low insertion losses (low attenuation of the signal) and a good linearity (low distortion of the signal, cause of harmonics);
- temperature stability of its figures of merit, in particular, in the operating range of the devices [−40° C.; 150° C.];
- a low capacitive coupling between the useful layer and the carrier substrate, typically achieved by virtue of a dielectric permittivity equal to or lower than that of silicon ($\varepsilon_{silicon}$=11).

The present disclosure also relates to a process for fabricating a substrate 10 suitable for radiofrequency microelectronic devices, as presented in FIGS. 9A-9E.

Figure 9A:
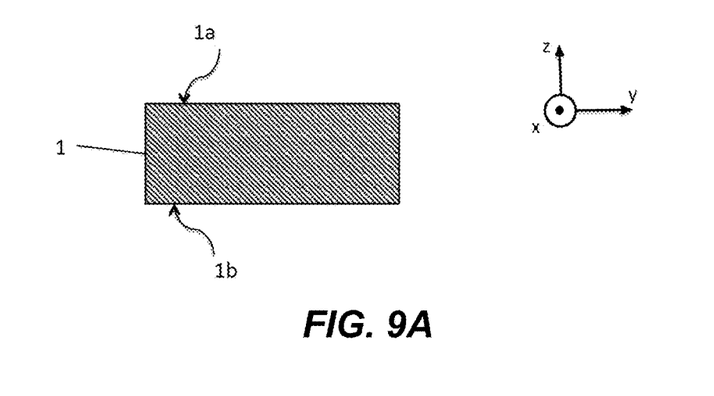
FIGS. 9A-9E illustrate a process for fabricating a substrate according to the present disclosure.

The process firstly comprises a step a) of providing a carrier substrate 1 made of semiconductor. The carrier substrate 1 has a front side, called the first side 1a and a back side, called the second side 1b (FIG. 9A).

The process then comprises a step b) comprising depositing a layer 2' formed from a mixture of powders of at least a first dielectric and a second dielectric different from the first, on the first side 1a of the carrier substrate 1.

Figure 9B:
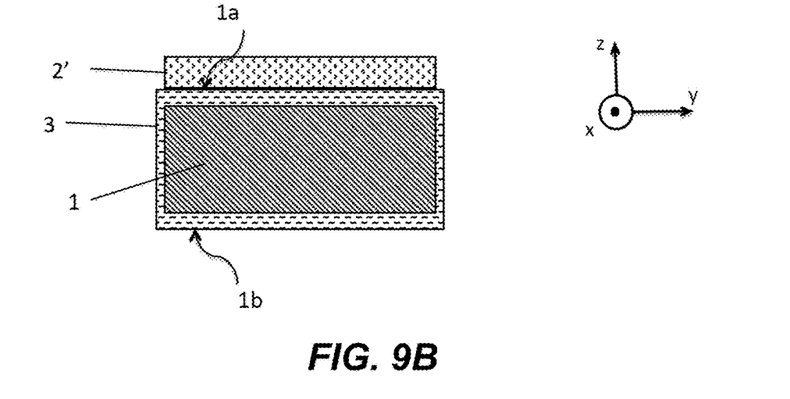

Optionally, the first side 1a of the carrier substrate 1 comprises a protective layer 3 produced prior to the deposition of the layer 2' of mixture of powders; the protective layer 3 may, as illustrated in FIG. 9B, completely encapsulate the carrier substrate 1, i.e., cover its back side 1b and its edge face. The protective layer 3 is formed by at least one material chosen from silicon nitride, a silicon oxynitride and a silicon oxide, and may be produced using various known chemical-deposition techniques. It makes it possible to avoid or at least to limit the diffusion of impurities contained in the layer 2' into the carrier substrate 1.

According to a first variant embodiment, the mixture of powders takes the form of a viscous paste.

Such a paste is customarily obtained by adding a liquid component, of solvent type (in particular, alcohol, for example, ethanol), to the dry mixture of powders. Typically, the powders used contain particles the average size of which is between about 1 and 10 microns. To form composite layers 2 of 5 to 10 microns thickness, the smallest sizes of particles will be preferred.

Alternatively, the mixture of powders may be incorporated into a silicon-based polymer matrix (polymer-derived ceramics or PDCs) that is able to be converted into ceramic at high temperature. It will be noted that in the case of a layer 2' with a PDC matrix, the sintered composite layer 2 that will subsequently be obtained will comprise the first and second dielectric of the mixture of powders, but also silicon originating from the conversion of the matrix into ceramic. Advantageously, a content of less than 30% silicon and in the composite layer 2 will be targeted. Since interstices are localized and not continuous in the composite layer 2, the presence of silicon in the interstices does not affect the dielectric character of the composite layer 2.

The layer 2' formed by the mixture in step b) may be deposited by, for example, spin coating, dip coating, or screen-printing through a mask.

The viscosity of the paste is adjusted via the ratio of the powders/liquid compound (solvent and/or polymer). The viscosity is chosen in order to allow a uniform deposition of the layer 2', at thicknesses larger than 5 microns, or even larger than 10 microns, and of up to about 100 microns.

The deposition of the layer 2' is followed by a heat treatment at low temperatures (for example, between 150° C. and 400° C.) allowing the solvent(s) to be removed from the layer 2' and any degassing subsequently in the process, in particular, after the bonding step (described below), to be avoided.

According to a second variant embodiment, the mixture of powders takes the form of a dry pulverulent and is deposited in a layer 2' on the first side 1a of the carrier substrate 1. This layer 2' may be shaped by compression molding or hot isostatic pressing. In both cases, a compressive stress is applied to the layer 2' to firmly attach the particles of the powders of the mixture to one another and to the first side 1a. A specific tool is needed to hold the pulverulent mixture on the substrate and to apply a uniform compressive stress to the entire surface of the substrate 1.

Figure 9C:
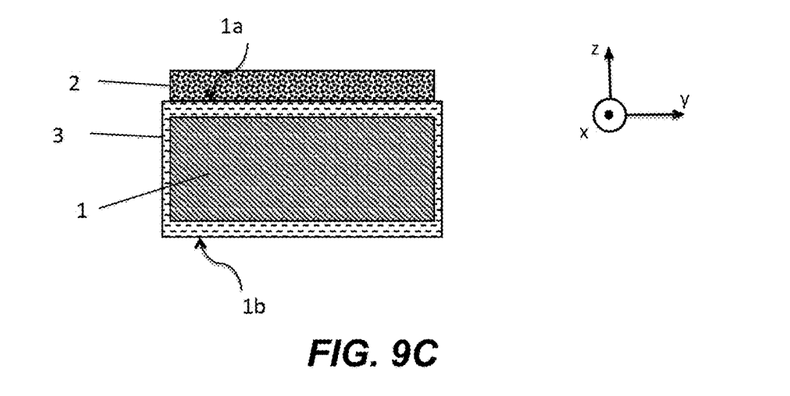

The fabrication process according to the present disclosure comprises a step c) comprising sintering the layer 2' formed from the mixture of powders, to obtain a sintered composite layer 2 that is firmly attached to the first side 1a of the carrier substrate 1 (FIG. 9C).

The sintering is customarily performed at high temperatures, typically above 1000° C., for a duration that may range from a few hours to around 24 hours. The sintering temperature nevertheless remains below the melting point of at least one of the powders contained in the layer 2'. Under the effect of the heat, the particles of the powders are bonded together, thereby achieving cohesion of the resulting composite layer 2. The composite layer 2 is also firmly attached to the first side 1a of the carrier substrate 1.

Optionally, the sintering may in addition be carried out under mechanical stress, which makes it possible to further compact the composite layer 2.

The sintered composite layer 2 is thus composed of particles of the first and second dielectric. Between the particles, depending on the degree of compaction, there may be more or fewer empty interstices (or interstices containing the ceramic resulting from a PDC matrix). Depending on the particle size distribution, the volume fraction of these interstices could reach about 50%, and will preferentially be kept below 25%, or even below 15%, in order to provide the composite layer 2 with a good mechanical strength. It will be noted that the interstices increase the density of traps (for mobile electric charges), this possibly being advantageous with regard to maintaining the high resistivity of the substrate (trapping layer).

The thickness of the layer 2' deposited in step b) is chosen so as to obtain the thickness desired for the sintered composite layer 2. Specifically, depending on the type of layer 2' deposited (in form of a paste with solvent and/or polymer or in dry form), the decrease in thickness during the sintering step will be greater or lesser. Depending on the circumstances, a decrease in volume of the layer 2' of about 10 to 30% may take place.

At the end of the sintering step, the sintered composite layer 2 according to the present disclosure must have a thickness larger than 5 microns.

In addition, according to the present disclosure, the nature of the first dielectric, the nature of the second dielectric, and the proportion of the dielectrics in the mixture of powders is chosen to give the sintered composite layer 2 a thermal expansion coefficient that is matched with that of the carrier substrate 1, to within plus or minus 30%.

Advantageously, as illustrated in FIG. 9C, the first side 1a of the carrier substrate 1 comprises a protective layer 3, prior to the deposition of the layer formed from the mixture of powders in step b). The protective layer 3 is formed by at least one material chosen from among silicon nitride, silicon oxynitride, and silicon oxide.

The fabrication process further comprises, after step c), a step d) of bonding a useful layer 5 and the carrier substrate 1 so as to place the sintered composite layer 2 between the useful layer 5 and the carrier substrate 1. The useful layer 5 will possibly be composed of a material chosen from the semiconductors, insulators or conductors, or even the piezoelectrics. It may, for example, be made of silicon, of silicon-germanium, of germanium, of a III-V material, of lithium niobate, of lithium tantalate, of aluminum nitride, of PZT, etc.

Preferentially, an intermediate layer 4 is deposited on the composite layer 2, prior to the bonding step d). By way of example, its thickness will possibly vary between a few nanometers and a few microns. Advantageously, the intermediate layer 4 is formed from a material chosen from silicon oxide, silicon nitride, a silicon oxynitride, and aluminum nitride. It will possibly be deposited by various known chemical-deposition techniques.

On the one hand, this intermediate layer 4 encapsulates the sintered composite layer 2, avoiding or at least limiting the risk of cross-contamination between the various layers of the substrate 10 according to the present disclosure; on the other hand, the intermediate layer 4 may be advantageous with a view to achieving a bond with the useful layer 5, as it will allow the surface of the intermediate layer 4 to be prepared in a conventional way, and not in a way specific to the composition of the sintered composite layer 2.

Advantageously, the bonding step is a step of direct bonding, by molecular adhesion, of the two surfaces brought into contact: i.e., of the first side 5a of the useful layer 5 and of the free side of the composite layer 2. The principle of molecular adhesion, which is well known in the prior art, will not be described in further detail here.

Alternatively, the bonding could be achieved by addition of a layer of adhesive material, or by any other bonding technique suitable for the intended application.

In most bonding processes, the substrates to be assembled are required to have a good surface finish (cleanliness, low roughness, etc.).

Figure 9D:
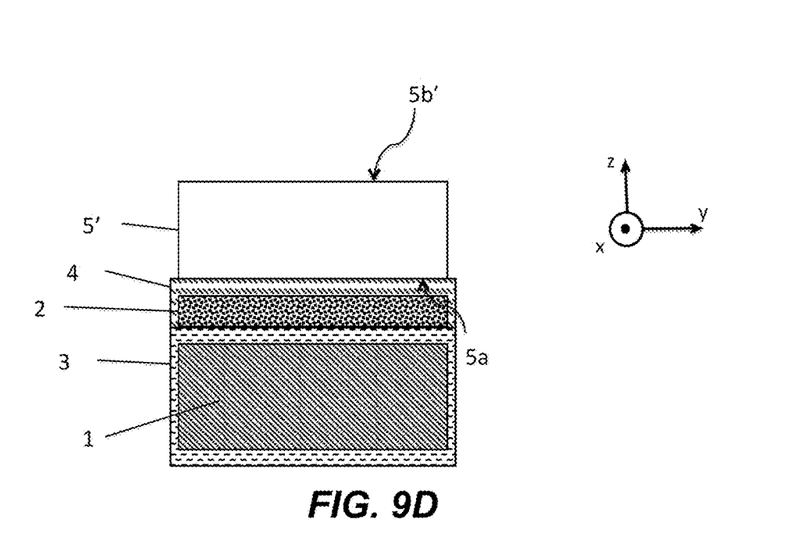

According to one variant, the useful layer 5 provided for bonding step d) is a donor substrate 5' composed of a material chosen from the semiconductors, insulators or conductors, or even the piezoelectrics (FIG. 9D).

Figure 9E:
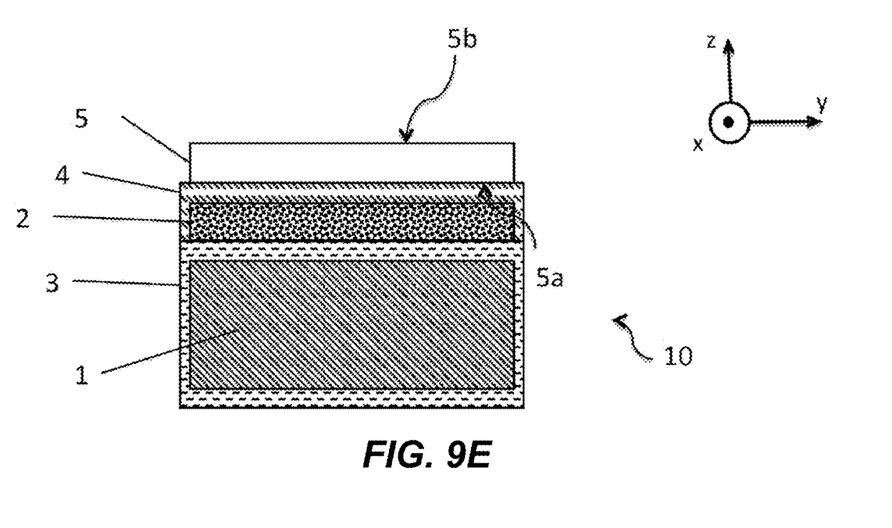

The fabrication process then comprises a step e) of thinning the donor substrate 5', from its back side 5b', to the thickness desired for the useful layer 5 for the fabrication of the radiofrequency microelectronic devices.

By way of example, the thinning step, step e), may be based on thin-film transfer processes known to those skilled in the art, among which:

the SmartCut™ process, which is based on implantation of light hydrogen and/or helium ions into a donor substrate (before the bonding step); a detaching step (after the bonding step) then allows a thin surface layer (the useful layer) to be separated from the donor substrate, level with the weakened plane defined by the implantation depth of the ions. Finishing steps, possibly including high-temperature heat treatments, lastly give the useful layer 5 the required surface and crystal quality. This process is particularly suitable for the fabrication of very thin useful layers, of thickness comprised between a few nanometers and about 1.5 µm, for example, for silicon layers.

the SmartCut™ process followed by a step of epitaxy, in particular, allowing thicker useful layers, for example, of a few tens of nanometers to 20 µm thickness, to be obtained.

mechanical, chemical and/or chemical-mechanical thinning processes; they consist in thinning the donor substrate from its back side to the thickness desired for the useful layer, for example, by grinding and polishing (chemical-mechanical polishing or CMP). These processes are particularly suitable for the transfer of what are referred to as thick layers, for example, layers of a thickness of a few microns to several tens of microns, or indeed of as much as a few hundred microns.

As mentioned above, the step e) of thinning will possibly comprise heat treatments for finishing the side 5b of the useful layer 5. The substrate 10 resists heat treatments well, even heat treatments at high temperatures (900° C. to 1100° C., or even 1200° C.), in particular, because the sintered composite layer 2 has a thermal expansion coefficient that is matched with that of the carrier substrate 1, thus limiting the associated stress and bow (curvature) of the substrate 10.

Figure 8:
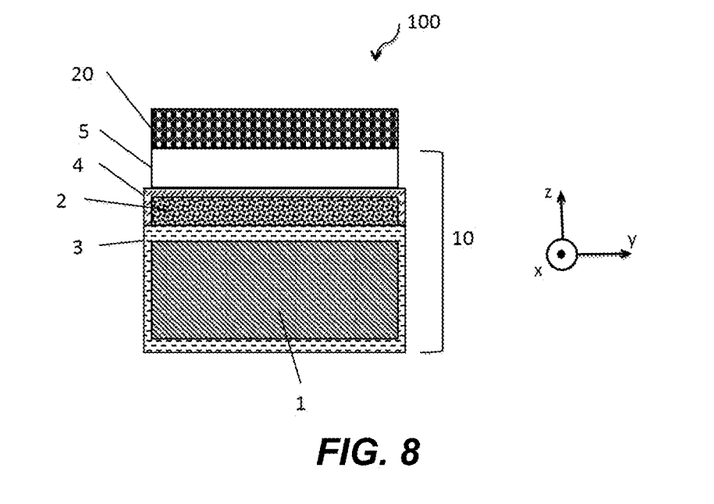
FIG. 8 shows a radiofrequency-microelectronic-device structure according to the present disclosure.

The present disclosure also relates to a radiofrequency-microelectronic-device structure 100 comprising:
a substrate 10 such as described above;
a layer of microelectronic devices 20, which layer is produced on the substrate 10 (FIG. 8) and, in particular, on the side 5b of the useful layer 5.

The microelectronic device will possibly be an antenna adapter or switch or a power amplifier or a low-noise amplifier or a passive component or other circuit operating at high frequency or a radiofrequency MEMS component or a radiofrequency filter.

Of course, the present disclosure is not limited to the described embodiments and examples and variant embodiments thereof may be envisaged, which do not depart from the scope of the invention such as defined by the claims.

What is claimed is:

1. A substrate including at least one radiofrequency microelectronic device, comprising:
a carrier substrate consisting essentially of silicon; and
a sintered composite layer placed on the carrier substrate and formed from powders of at least a first dielectric and a second dielectric different from the first, the sintered composite layer having a thickness larger than 5 microns, a thermal expansion coefficient that is matched with that of the carrier substrate to plus or minus 30%, the sintered composite layer including particles of the first dielectric, particles of the second dielectric, and interstices between the particles of the first dielectric and the particles of the second dielectric, a volume fraction of the interstices in the sintered composite layer being between 0% and 50%;

an intermediate layer on the sintered composite layer on a side thereof opposite the carrier substrate; and a useful layer directly, molecularly bonded to the intermediate layer, at least a portion of the useful layer forming at least a portion of a radiofrequency microelectronic device.

2. The substrate of claim 1, wherein the sintered composite layer has a thickness between 10 microns and 100 microns.

3. The substrate of claim 1, wherein the carrier substrate has a resistivity higher than 500 ohm·cm.

4. The substrate of claim 1, wherein the carrier substrate consists essentially of single crystal silicon.

5. The substrate of claim 1, wherein the first and second dielectrics are chosen from among silicon oxide, silicon nitride, aluminum nitride, alumina, and mullite.

6. The substrate of claim 1, further comprising a protective layer between the carrier substrate and the sintered composite layer.

7. The substrate of claim 1, wherein the intermediate layer is a dielectric layer comprising a material chosen from among a silicon oxide, a silicon nitride, a silicon oxynitride, and an aluminum nitride.

8. The substrate of claim 1, wherein the useful layer comprises a material chosen from among a semiconductor material, an electrically insulating material, an electrically conducting material, and a piezoelectric material.

9. A radiofrequency-microelectronic-device structure, comprising:
a substrate according to claim 8; and
a layer of microelectronic devices on the substrate.

10. The structure of claim 9, wherein the radiofrequency-microelectronic-device is an antenna adapter or switch or a power amplifier or a low-noise amplifier or a passive component or other circuit operating at high frequency or a radiofrequency MEMS component or a radiofrequency filter.

11. A method for fabricating a substrate including a radiofrequency microelectronic device, comprising the following steps:
providing a carrier substrate consisting essentially of silicon, having a first side;
depositing a layer formed from a mixture of powders of at least a first dielectric and a second dielectric different from the first dielectric, on the first side of the carrier substrate; and
sintering the layer formed from the mixture of powders in order to obtain a sintered composite layer attached to the first side of the carrier substrate and having a thickness larger than 5 microns, the sintered composite layer including particles of the first dielectric, particles of the second dielectric, and interstices between the particles of the first dielectric and the particles of the second dielectric, a volume fraction of the interstices in the sintered composite layer being between 0% and 50%; the first dielectric, the second dielectric and a proportion of the first and second dielectrics in the mixture of powders being chosen to give the sintered composite layer a thermal expansion coefficient that is matched with that of the carrier substrate to plus or minus 30%;

depositing an intermediate layer on the sintered composite layer on a side thereof opposite the carrier substrate; and directly bonding, by molecular adhesion, a useful layer to the intermediate layer such that the intermediate layer and the sintered composite layer are disposed between the useful layer and the carrier substrate, at least a portion of the useful layer forming at least a portion of a radiofrequency microelectronic device.

12. The method of claim 11, further comprising forming a protective layer on the first side of the carrier substrate prior to the depositing of the layer formed from the mixture of powders on the first side of the carrier substrate.

13. The method of claim 12, wherein the protective layer comprises at least one material chosen from among silicon nitride, silicon oxynitride, and silicon oxide.

14. The method of claim 11, wherein the depositing the layer formed from the mixture of powders on the first side of the carrier substrate comprises forming a paste including at least one liquid component and the mixture of powders, and depositing the paste on the first side of the carrier substrate by spin coating.

15. The method of claim 14, wherein the deposition of the layer formed by the mixture of powders is followed by a low-temperature heat treatment to remove at least one liquid component from the paste.

16. The method of claim 11, wherein the useful layer provided for the directly bonding to the intermediate layer is a donor substrate comprising a material chosen from among a semiconductor material, an electrically insulating material, an electrically conducting material, and a piezoelectric material.

17. The method of claim 16, comprising a further step, after bonding the donor substrate to the intermediate layer, comprising thinning the donor substrate to a thickness desired for the useful layer for the fabrication of the radiofrequency microelectronic device.

* * * * *